United States Patent [19]

Murakami et al.

[11] 4,212,029

[45] Jul. 8, 1980

[54] ELASTIC SURFACE WAVE FILTER FOR COLOR TELEVISION RECEIVER

[75] Inventors: Takeshi Murakami; Katashi Hazama, both of Yokohama, Japan

[73] Assignee: Hitachi, Ltd., Japan

[21] Appl. No.: 825,039

[22] Filed: Aug. 16, 1977

[30] Foreign Application Priority Data

Aug. 20, 1976 [JP] Japan .................................. 51-98757

[51] Int. Cl.² ............................................ H04N 9/535
[52] U.S. Cl. .................................................. 358/21 R
[58] Field of Search ............... 358/21, 23, 35, DIG. 1; 333/30 R, 72, 150, 193; 310/313

[56] References Cited

U.S. PATENT DOCUMENTS

| | | | |
|---|---|---|---|
| 2,906,866 | 9/1959 | Thompson | 358/35X |
| 3,726,990 | 4/1973 | Adler et al. | 358/31 |
| 4,062,044 | 12/1977 | Hanma et al. | 358/21 |

FOREIGN PATENT DOCUMENTS

946489  4/1974  Canada .................................... 333/72

OTHER PUBLICATIONS

"Case History of a Surface-Wave TV IF Filter For Color Television Receivers" Proceedings of the IEEE, vol. 64, No. 5, May 1976: Adler et al. pp. 671–676.

Proceedings of the IEEE, vol. 64, No. 5, May 1976; *A Television IF Acoustic Surface Wave Filter on Bismuth Silicon Oxide,* Parker et al.

IEEE Transactions on Microwave Theory & Technique, vol. MTT 21, No. 4 Apr. 1973 *Impulse Model Design of Acoustic Surface Wave Filters,* Hartmann et al.

*Primary Examiner*—John C. Martin
*Assistant Examiner*—Aristotelis M. Psitos
*Attorney, Agent, or Firm*—Craig & Antonelli

[57] ABSTRACT

It has been known that a sound trap or band pass amplifier makes the group delay characteristic of a chromaticity signal component non-uniform. The present invention provides an elastic surface wave filter whose amplitude characteristic is so determined as to be adapted for a video intermediate frequency amplifier and whose group delay characteristic is so determined that the chromaticity signal component in a color composite video signal from a tuner advances further in delay time on the high frequency side than on the low frequency side in order to compensate that non-uniformity of the group delay characteristic from which the chromaticity signal component suffers.

10 Claims, 3 Drawing Figures

ELASTIC SURFACE WAVE FILTER FOR COLOR TELEVISION RECEIVER

LIST OF PRIOR ART REFERENCES (37 CFR 1.56 (a))

The following references are cited to show the state of the art:

1. Colour Television P. S. Carnt and G. B. Townsend, p. 113-114
2. U.S. Pat. No. 3,726,990 Robert Adler et al., Apr. 10, 1973
3. IEEE TRANSACTIONS ON MICROWAVE THEORY AND TECHNIQUES, Vol. MTT-21, No. 4, Apr. 1973, p. 162-175, "Impulse Model Design of Acoustic Surface-Wave Filters"
4. U.S. Pat. No. 3,663,899 Eugene Dieulesaint et al., May 16, 1972
5. 1974 Ultrasonics Sympsium Proceedings, IEEE Cat. #74 CHO 896-1SV, p. 168-171 "A TECHNIQUE FOR SAW BANDPASS FILTER DESIGN".

BACKGROUND OF THE INVENTION

1. FIELD OF THE INVENTION

The present invention relates to an elastic surface wave filter suitably adapted for use in a color television receiver.

2. DESCRIPTION OF THE PRIOR ART

In common color television receivers in the prior art, a high frequency television signal received by an antenna is supplied to a tuner and converted to a video intermediate frequency signal. The video intermediate frequency signal is amplified by a video intermediate frequency amplifier having a predetermined amplitude-frequency characteristic and then video-detected to be a color composite video signal. The color composite video signal of an NTSC system used, for example, in Japan or U.S.A. comprises a sound signal component with a sound carrier of 4.5 MHz frequency-modulated by a sound signal, a chromaticity signal component with a sub-carrier of 3.58 MHz modulated according to a quadrature phase modulation by red and blue color difference signals, and a luminance signal ranging in frequency from 0 to 4 MHz. The color composite video signal is fed to a sound channel including a narrow band pass filter for passing therethrough the sound signal component, an FM demodulator and the line, and also to a sound trap for attenuating the sound signal component. The color composite video signal with its sound signal component attenuated by the sound trap is supplied to a chromaticity channel including a band pass amplifier for passing therethrough the chromaticity signal component, a color difference signal demodulator and the like, and also to a luminance channel including a chromaticity signal trap and a delay line for compensating the difference of a delay time between the the chromaticity channel and luminance channel. Red, blue and green color difference signals fed out from the chromaticity channel and a luminance signal from the luminance channel are supplied to a matrix circuit and converted to red, blue and green primary colors each making primary colored fluorescent materials on the color picture tube luminescent.

The band pass amplifier in the chromaticity channel serves to pass therethrough the chromaticity signal component and prevent the passage of low frequency components in the luminance signal component, and thus has the pass band ranging from 3.08 to 4.08 MHz. The delay time of the luminance signal passing through the luminance channel is generally shorter by 0.4 to 1.0 $\mu$s than that of the signals near to the color sub-carrier passing through the chromaticity channel because the luminance channel has a wider band than the chromaticity channel. For this reason, the luminance channel is provided with a delay line for compensating the difference between these delay times to remove the difference of the delay time between the luminance signal and the signal near to the color sub-carrier.

Such a color television receiver, however, has the drawback that the delay time of the chromaticity signal passing through the chromaticity channel depends upon its frequency with colors not fully reproducible on the screen of the receiver. In other words, the chromaticity signal component which has passed the sound trap is attenuated more strongly as its frequency has the component nearer to the frequency of the sound trap, i.e., as it has the higher frequency component, so that the band pass amplifier is so provided that it is free therefrom and produces an output having a flat amplitude characteristic. If the chromaticity signal passes through a transmission line having a non-uniform amplitude characteristic, this leads to a non-uniform group delay characteristic and the dependency of the delay time of the color signal component upon its frequency with the above-mentioned drawback. This fact is disclosed in "Colour Television", pages 113 and 114, written by P. S. Carnt, G. B. Townsend and published in 1968 by Iliffe Books Ltd. (London). In the associated pages of this book there is described the fact that the delay time of the chromaticity signal component depends upon its frequency, i.e., that is transmitted signal is provided with such a group delay characteristic as to compensate the non-uniformity of the group delay characteristic. It, however, has been found that the chromaticity signal has no uniform group delay characteristic even if the transmitted signal has its group delay characteristic changed.

SUMMARY OF THE INVENTION

An object of the present invention is to provide an elastic surface wave filter being capable of providing a uniform group delay characteristic to a chromaticity signal component processed in the chromaticity channel.

Another object of the present invention is to provide an elastic surface wave filter being capable of compensating the non-uniform group delay characteristic of the chromaticity signal component as well as the difference of a delay time between the chromaticity and luminance channels.

According to the present invention there is provided an elastic surface wave filter which has a given amplitude characteristic and comprises a piezo-electric substrate allowing an elastic surface wave to be propagated, an input converter provided on the piezo-electric substrate for converting an electric signal to an elastic surface wave, and an output converter provided on the piezo-electric substrate for converting the elastic surface wave from the input converter to an electric signal.

A color television signal including the chromaticity and sound signal components is caused to pass through the elastic surface wave filter and then detected for video signals. The thus detected color television signal is fed to the band pass amplifier, which produces at its output a chromaticity signal component. Further, the transmission line for the color television signal is provided with sound attenuating means for attenuating the sound signal component.

In order to compensate the non-uniformity of group delay characteristic of the transmission line for the chromaticity signal component except for the elastic surface wave filter, the elastic surface wave filter has its group delay characteristic so determined as to be symmetrical to the above-mentioned non-uniform group delay characteristic.

According to another aspect of the present invention, the elastic surface wave filter has its group delay characteristic so determined that the chromaticity signal component procedes the low frequency component of the luminance signal component by a time corresponding to the difference between the delay time of the luminance channel for primarily transmitting the luminance signal component in the color television signal and the delay time of the chromaticity channel for primarily transmitting the chromaticity signal component, thereby eliminating the difference between both the delay times.

DESCRIPTION OF THE PREFERRED EMBODIMENTS

Figure 1:
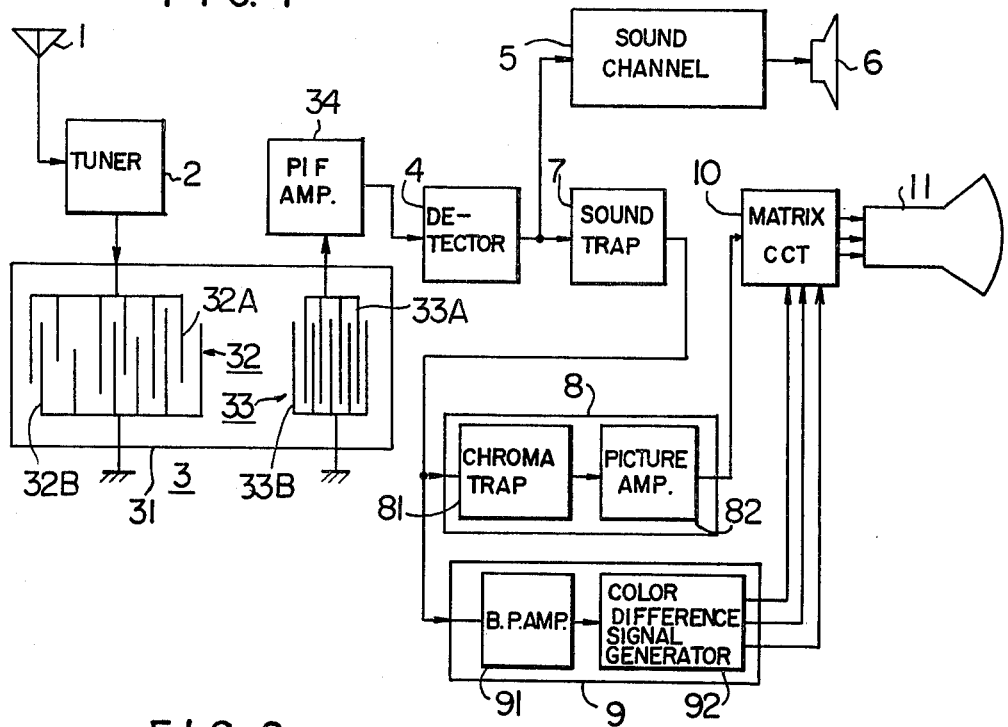
FIG. 1 is a block diagram showing essential portions of a color television receiver in which an embodiment of an elastic surface wave filter according to the present invention is used.

In FIG. 1, the color television signal received by an antenna 1 is frequency-modulated to a video intermediate frequency signal by a tuner 2 and fed to an elastic surface wave filter 3. The elastic surface wave filter 3 includes an input converter 32 and an output converter 33 each provided on a piezo-electric substrate 31 and comprising comb-shaped electrodes 32A, 32B and 33A, 33B which are linked to each other, respectively. The input converter 32 is supplied with the video intermediate frequency signal from the tuner 2 and generates an elastic surface wave towards the output converter 33. The output converter 33 receives the elastic surface wave, and converts it again to an electric signal, which is supplied to a video intermediate frequency amplifier 34. As will be described later, the elastic surface filter 3 has an amplitude characteristic and a group delay characteristic as indicated by A, B in FIG. 2. The video intermediate frequency signal from the video intermediate frequency amplifier 34 is detected for video signals by a video detector 4. A color composite video signal produced at the output of the video detector 4 includes a second signal component, luminance signal component and chromaticity signal component. The sound signal component is supplied to a sound channel 5 and produces a sound through a speaker 6. The color composite video signal is, on the other hand, supplied to a luminance channel 8 and a chromaticity channel 9 after it has passed through a sound trap 7 serving to attenuate the sound signal component. The color composite video signal fed to the luminance channel 8 also has its chromaticity signal component attenuated by a chromaticity trap 81. Thus, the low frequency component in the luminance signal component which is of the order of 0 to 2 MHz is primarily amplified by a video amplifier 82 and supplied to a matrix 10. The color composite video signal supplied to the chromaticity channel 9 has its low frequency components removed therefrom by a band pass amplifier 91 and has its chromaticity signal component generated at the output of the band pass amplifier 91. A color difference signal generator 92 generates red, green and blue color difference signals from the chromaticity signal component, which are then supplied to the matrix circuit 10. The matrix circuit 10 generates red, green and blue primary color signals from the luminance signal and three color difference signals, and supplies them to a color cathode ray tube 11. It is to be noted that a horizontal deflector, vertical deflector, high voltage generator and the like are removed from the block diagram of FIG. 1 because they are useless for the description of the present invention.

Figure 3:
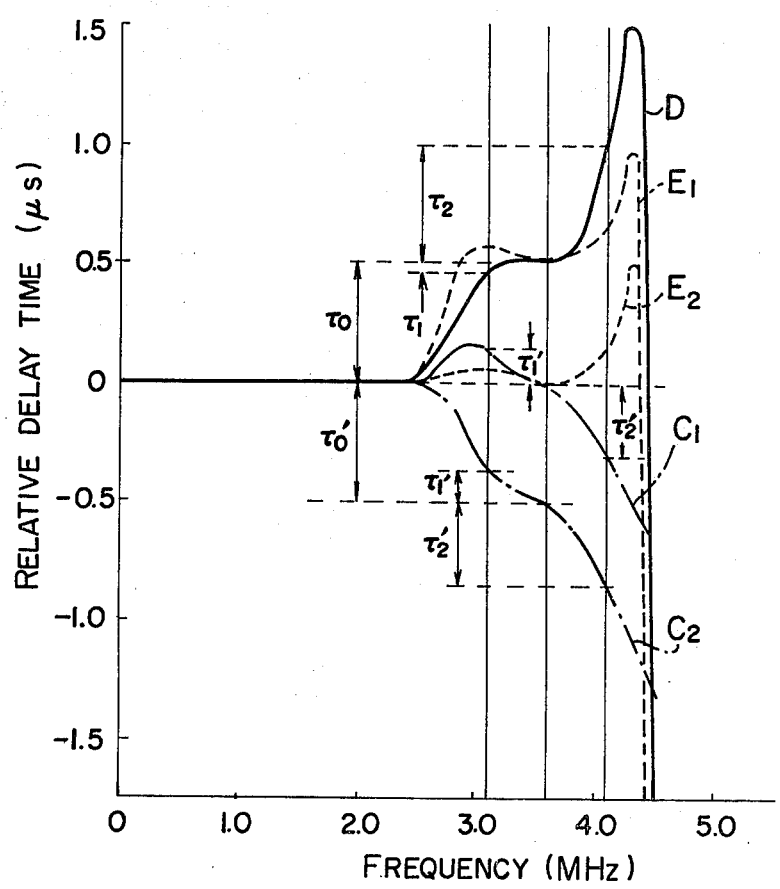
FIG. 3 is characteristic curves showing one example of group delay characterstics of a signal at the output of a band pass amplifier.

In FIG. 3, $C_1$ and $C_2$ each shows a delay time caused to occur in the color composite video signal by the elastic surface wave filter 3, and D a delay time caused to occur therein by a transmission line from a transmitting station of the color television signal to the band pass amplifier 91 except for the elastic surface wave filter 3. $E_1$ and $E_2$ each show a resultant delay time of the delay times $C_1$ and D; $C_2$ and D. Each delay time is represented to be relative on the basis of the delay time of the low frequency component as near as 0 to 2 MHz, i.e., of the essential portions of the luminance signal.

The non-uniformity of the group delay characteristic caused in the chromaticity signal component by the sound trap and the like might previously be compensated on the transmission side as shown in the previously mentioned literature "Colour Television", but the compensation is insufficient even in this case. The compensation is also made for the group delay characteristic of the chromaticity signal component on the transmission side, for example, in the NTSC system used in Japan or U.S.A., but the compensation on the transmission side is extremely insufficient. For example, the band pass amplifier of the common NTSC color television receiver using a video intermediate filter of coils or capacitors has at its output a group delay characteristic substantially equal to that shown by D in FIG. 3 with the unsatisfactory compensation of the group delay characteristic.

Figure 2:
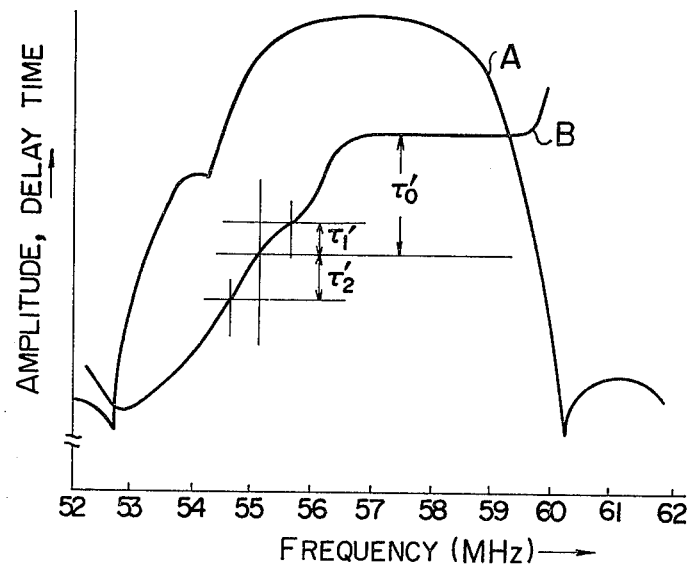
FIG. 2 is a characteristic curves showing one example of an amplitude characteristic and one example of a group delay characteristic of the elastic surface wave filter used in FIG. 1.

On the other hand, the utilization of a Fourier transformation in the design of the elastic surface wave filter is shown in U.S. Pat. No. 3,663,899 and IEEE TRANSACTION ON MICROWAVE THEORY AND TECHNIQUES, VOL. MTT-21, No. 4, APRIL 1973, P. 162 to 175. According to the teachings of these literatures, the electrodes 32A, B and 33A, B are determined in position and length by an impulse response $$h(t) = \frac{1}{\pi} \int_0^\infty s(\omega) \cos[\nu t + \phi(\omega)] d\omega$$

which is obtained by the Fourier transformation from a phase characteristic $$\phi(\omega) = \frac{1}{\pi} \int_0^\infty \tau(\omega) d\omega$$

on the basis of an amplitude characteristic s(ω) as shown by A in FIG. 2 and a group delay characteristic as shown by B in FIG. 2.

The elastic surface wave filter 3 is so designed as to have the amplitude characteristic and group delay characteristic as shown by A, B in FIG. 2. The amplitude characteristic shown by A in FIG. 2 is substantially the same as that of the video intermediate frequency amplifier in the common color television receiver, but the group delay characteristic of B in FIG. 2 is greatly different from the conventional one.

The curve $C_2$ in FIG. 3 corresponds to the group delay characteristic B in FIG. 2 with its frequency converted to a base band. The color signal component is influenced by the non-uniform group delay characteristic due to the transmission line other than the elastic surface wave filter 3, so that it advances $\tau_1$ μsec at 3.08 MHz on the low frequency side about the center frequency component of 3.58 MHz and delays $\tau_2$ μsec at 4.08 MHz on the high frequency side. The difference $\tau_0$ μsec of the delay time between the component of 3.58 MHz and the low frequency component of the order of 0 to 2 MHz is substantially equal to that of the delay times in the chromaticity and luminance channels 8 and 9.

In order to compensate the non-uniformity of the group delay characteristic by which the chromaticity signal component is influenced along the transmission path thereof except for the elastic surface wave filter 31 and to achieve an ultimately uniform group delay characteristic, the elastic surface wave filter 31 need only be provided with non-uniformity which is symmetrical with the above-mentioned non-uniformity. In other words, the elastic surface wave filter 31 is so determined that it has such a non-uniform group delay characteristic that the signal component of 3.08 MHz advances $\tau_1$ μsec and the signal component of 4.08 MHz delays $\tau_2$ μsec in comparison with the delay time of the signal component of 3.58 MHz. This allows the chromaticity signal component at the output of the band pass amplifier 91 to be constant in delay time without any dependence upon its frequency and to be coincident in terms of time in each frequency component.

It will now be assumed that the group delay characteristic of the elastic surface wave filter 31 is so determined as shown by $C_1$ in FIG. 3 with its frequency band converted to the base band with a delay of $\tau_1'$ μsec at 3.08 MHz and an advance of $\tau_2'$ μsec at 4.08 MHz relative to the low frequency component of the order of 0 to 2 MHz. This presents at the output terminal of the band pass amplifier 91 a group delay characteristic of the chromaticity signal component as shown by $E_1$ in FIG. 3 which is substantially uniform at the frequencies from 3.08 to 4.08 MHz. The times $\tau_1'$, $\tau_2'$ are preferably made coincident with the times $\tau_1$, $\tau_2$, respectively. Generally, however, $\tau_1'$ is of the order of 0.1 to 0.2 μsec and $\tau_2'$ is of the order of 0.2 to 0.3 μsec. In this case, the chromaticity signal component whose group delay characteristic is made uniform delays substantially $\tau_0$ μsec relative to the low frequency component of the order of 0 to 2 MHz constituting essential portions of the luminance signal, so that a delay line must be provided in the luminance channel 9 to compensate the delay as is the case with the conventional color television receiver.

If the group delay characteristic as shown by $C_1$ in FIG. 3 is advanced $\tau_0'$ substantially equal to $\tau_0$ for the signals from 3.08 MHz to 4.08 MHz as shown by $C_2$ in FIG. 3, then the group delay characteristic of the chromaticity signal component is made uniform and the chromaticity signal component is made advanced $\tau_0'$ μsec relative to the low frequency component of the order of 0 to 2 MHz. This allows the elimination of the delay line required for the conventional color television receiver because the chromaticity signal component at the output terminal of the band pass amplifier 91 receives no delay relative to the low frequency component of the order of 0 to 2 MHz. $\tau_0'$ is preferably selected to be equal to the difference between the delay time of the luminance channel 8 and that of the chromaticity channel 9, but common selected to be of the order of 0.4 to 1.0 μsec.

Thus, it has been understood that the group delay characteristic of the chromaticity signal component can be compensated if the elastic surface wave filter 3 is provided with the group delay characteristics $C_1$, $C_2$ which are symmetrical to the group delay characteristic D with respect to a line parallel to the frequency axis. This parallel line can be selected arbitarily. A difference of the delay times caused by this selection in the luminance and chromaticity channels 8, 9 can be compensated by providing either one of the channels with a delay line.

It is to be noted that it is possible to neglect the compensation of the group delay characteristic for the chromaticity signal component and eliminate the difference of the delay times in the luminance and chromaticity channels 8, 9. In this case, the group delay characteristic of the elastic surface wave filter 3 need only be so determined that the chromaticity signal component may advance by the difference of the delay times relative to the low frequency component of the luminance signal component.

We claim:
1. A color television receiver, comprising:
  a signal source for generating a color television signal which comprises a color composite video signal including a chromaticity signal component and a sound signal component;
  a video detector for detecting said color composite video signal from said color television signal;
  an elastic surface wave filter which provides said color television signal with a given amplitude characteristic and comprises a piezo-electric substrate permitting an elastic surface wave to be propagated, an input converter provided on said piezo-electric substracte for converting said color television signal to an elastic surface wave, and an output converter provided on said piezo-electric substrate for converting said elastic surface wave from said input converter again to an electric signal which includes said chromaticity signal component and which is fed to said video detector;
  a band pass amplifier for extracting said chromaticity signal component from said color composite video signal from said video detector and for amplifying the same; and
  sound signal attenuating means provided in a signal transmission line from said signal source to said band pass amplifier for attenuating said sound signal component and for causing a group delay distortion to said chromaticity signal component passing therethrough,
  said elastic surface wave filter being provided with a nonuniform group delay characteristic which is symmetrical with a group delay characteristic given to said chromaticity signal component by said signaal transmission line including said sound signal attenuating means except for said elastic surface wave filter, whereby said signal transmission line including said elastic surface wave filter provides said chromaticity signal component with a uniform group delay characteristic.

2. An elastic surface wave filter according to claim 1, wherein said input and output converters each comprise comb-shaped electrodes linked to each other, said electrodes being arranged on the basis of an impulse response obtained by a Fourier-transformed transmission characteristic of a filter determined by said amplitude and nonuniform group delay characteristics.

3. An elastic surface wave filter according to claim 1, wherein said elastic surface wave filter provides one transmission line for said color television signal coupled between said signal source and said video detector for providing said color television signal with a given amplitude characteristic and said nonuniform group delay characteristic.

4. A color television receiver according to claim 3, wherein said elastic surface wave filter includes a single input converter and a single output converter.

5. A color television receiver according to claim 1, which further comprises a chromaticity channel connected to said video detector for transmitting said chromaticity component therealong;
a luminance channel connected to said video detector for transmitting said luminance signal component therealong at a delay time shorter than that in said chromaticity channel; and
display means for providing a color display in response to composite output signals from said chromaticity and luminance channels, and said elastic surface wave filter provides said electric signal with said nonuniform group delay characteristic which causes a signal in said luminance band to be delayed relative to a signal in said chromaticity band by a time corresponding to the difference of delay times in said chromaticity and luminance channels.

6. A color television receiver comprising:
a signal source for generating a color television signal which comprises a color composite video signal including a chromaticity signal component occupying a chromaticity band and a luminance signal component at least occupying a chromaticity band and a luminance signal component at least occupying a luminance band different from said chromaticity band;
a video detector for detecting said color composite video signal from said color television signal;
filter means connected between said signal source and said video detector for providing said color composite video signal with a given amplitude characteristic;
a chromaticity channel connected to said video detector for transmitting said chromaticity component therealong;
a luminance channel connected to said video detector for transmitting said luminance signal component therealong at a delay time shorter than that in said chromaticity channel; and
display means for providing a color display in response to composite output signals from said chromaticity and luminance channels,
wherein said filter means comprises a piezo-electric substrate permitting an elastic surface wave to be propagated, an input converter provided on said piezo-electric substrate for converting said color television signal from said signal source to an elastic surface wave, and an output converter provided on said piezo-electric substrate for converting said elastic surface wave from said input converter to an electric signal selected with said given amplitude characteristic and supplied to said video detector, said filter means being provided with a group delay characteristic which causes a signal in said luminance band to be delayed relative to a signal in said chromaticity band by a time corresponding to the difference of delay times in said chromaticity and luminance channels.

7. An elastic surface wave filter according to claim 6, wherein said input and output converters each comprise comb-shaped electrodes linked to each other, said comb electrodes being arranged on the basis of an impulse response obtained by a Fourier-transformed transmission characteristic of a filter determined by said amplitude and group delay characteristics.

8. An elastic surface wave filter according to claim 6, wherein said filter means provides one transmission line for said color composite video signal coupled between said signal source and said video detector for providing said color composite video signal with a given amplitude characteristic and group delay characteristics.

9. A color television receiver according to claim 8, wherein said elastic surface wave filter includes a single input converter and a single output converter.

10. In a color television receiver, comprising:
a signal source for generating a color television signal which comprises a color composite video signal including a chromaticity signal component, a luminosity component and a sound signal component;
a video detector for detecting said color composite video signal from said color television signal;
an elastic surface wave filter which provides said color television signal with a given amplitude characteristic and comprises a piezo-electric substrate permitting an elastic surface wave to be propagated, an input converter provided on said piezo-electric substrate for converting said color television signal to an elastic surface wave, and an output converter provided on said piezo-electric substrate for converting said elastic surface wave from said input converter again to a color composite video electric signal which includes said chromaticity signal component, said luminosity component, and said sound signal component and which is fed to said video detector;
a band pass amplifier for extracting said chromaticity signal component from said color composite video signal from said video detector and for amplifying the same; and
sound signal attenuating means provided in a signal transmission line from said signal source to said band pass amplifier for attenuating said sound signal component, and for causing a group delay distortion to said chromaticity signal component passing therethrough, said elastic surface wave filter being provided with an nonuniform group delay characteristic which is symmetrical with a group delay characteristic given to said chromaticity signal component by said signal transmission line including said sound signal attenuating means and except for said elastic surface wave filter, whereby said signal transmission line including said elastic surface wave filter provides said chromaticity signal component with a uniform group delay characteristic.

* * * * *